(12) United States Patent
Choi et al.

(10) Patent No.: US 7,417,494 B2
(45) Date of Patent: Aug. 26, 2008

(54) INTERNAL VOLTAGE GENERATOR

(75) Inventors: Jun-Gi Choi, Kyoungki-do (KR); Yoon-Jae Shin, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 85 days.

(21) Appl. No.: 11/478,077

(22) Filed: Jun. 30, 2006

(65) Prior Publication Data
US 2007/0069802 A1    Mar. 29, 2007

(30) Foreign Application Priority Data
Sep. 29, 2005   (KR) .............. 10-2005-0090940
Dec. 15, 2005   (KR) .............. 10-2005-0123982

(51) Int. Cl.
*G05F 1/10*   (2006.01)

(52) U.S. Cl. .................................... 327/541

(58) Field of Classification Search ............... 327/535, 327/537, 538, 540, 541, 543
See application file for complete search history.

(56) References Cited

U.S. PATENT DOCUMENTS

| | | | |
|---|---|---|---|
| 5,349,290 A | 9/1994 | Yamada | |
| 5,929,696 A * | 7/1999 | Lim et al. | 327/540 |
| 6,184,744 B1 * | 2/2001 | Morishita | 327/541 |
| 6,333,873 B1 | 12/2001 | Kumanoya et al. | |
| 6,522,193 B2 | 2/2003 | Shin | |
| 6,653,888 B2 | 11/2003 | Lee | |
| 6,661,279 B2 * | 12/2003 | Yabe | 327/546 |
| 7,142,044 B2 * | 11/2006 | Sano | 327/540 |
| 7,282,989 B2 * | 10/2007 | Byeon | 327/541 |
| 2002/0089370 A1 | 7/2002 | Shin | |

FOREIGN PATENT DOCUMENTS

| | | |
|---|---|---|
| JP | 2000-156097 | 6/2000 |
| JP | 2003-124318 | 4/2003 |
| KR | 1999-010763 A | 2/1999 |

* cited by examiner

*Primary Examiner*—Jeffrey S Zweizig
(74) *Attorney, Agent, or Firm*—McDermott Will & Emery LLP

(57) ABSTRACT

An internal voltage generator supplies a stable internal voltage without increasing standby current. The internal voltage generator includes an internal voltage driver for supplying an internal voltage based on a control signal, a feedback circuit for supplying a feedback voltage having a voltage level proportional to the internal voltage, a control signal generating circuit for generating the control signal to control the internal voltage driver such that the feedback voltage is maintained at a desired reference voltage, an auxiliary driving circuit for additionally supplying the internal voltage in response to the control signal, and an auxiliary driving control circuit for activating the auxiliary driving circuit only when it is expected to dissipate a large amount of a current.

28 Claims, 2 Drawing Sheets

INTERNAL VOLTAGE GENERATOR

FIELD OF THE INVENTION

The present invention relates to a semiconductor device; and, more particularly, to an internal voltage generator for supplying a stable internal voltage without increasing a standby current.

DESCRIPTION OF RELATED ARTS

In a semiconductor memory device, an internal voltage generator receives an external voltage VDD to generate an internal voltage having various levels.

With the recent trend of low voltage and low power consumption, an internal voltage generator is employed in a dynamic random access memory (DRAM).

Since the internal voltage of the semiconductor memory device is generated therewithin, many attempts have been made to generate a stable internal voltage without regard to changes of ambient temperature, process, pressure, etc.

Often, a plurality of internal voltage generators are provided to supply an amount of current required by the semiconductor memory device. In a DDR2 memory device, which output 16-bit data instead of 4-bit or 8-bit data, the number of cells to be activated increases twofold in comparison with other memory devices. Therefore, the DDR2 memory device includes two times the number of internal voltage generators. A sufficient current supply is required to satisfy the large number of internal voltage generators and obtain a fast response speed.

However, the increase in the number of the internal voltage generators may cause standby current to increase to a level that exceeds the desired specification of the semiconductor memory device.

SUMMARY OF THE INVENTION

It is, therefore, an object of the present invention to provide an internal voltage for supplying a stable internal voltage without increasing standby current.

In accordance with an aspect of the present invention, there is provided an internal voltage generator having an internal voltage driver for supplying an internal voltage based on a control signal; A feedback circuit supplies a feedback voltage having a voltage level proportional to the internal voltage. A control signal generating circuit compares the feedback voltage with a desired reference voltage to generate the control signal based on the comparison result. An auxiliary driving circuit additionally supplies the internal voltage in response to the control signal.

In accordance with another aspect of the present invention, there is provided an internal voltage generator including: an internal voltage driver for supplying an internal voltage based on a control signal; a feedback circuit for supplying a feedback voltage having a voltage level proportional to the internal voltage; a control signal generating circuit for generating the control signal to control the internal voltage driver such that the feedback voltage is maintained at a desired reference voltage; an auxiliary driving circuit for additionally supplying the internal voltage in response to the control signal; and an auxiliary driving control circuit for activating the auxiliary driving circuit only when it is expected to dissipate a large amount of a current.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

An internal voltage generator in accordance with exemplary embodiments of the present invention will be described in detail with reference to the accompanying drawings.

Figure 1:
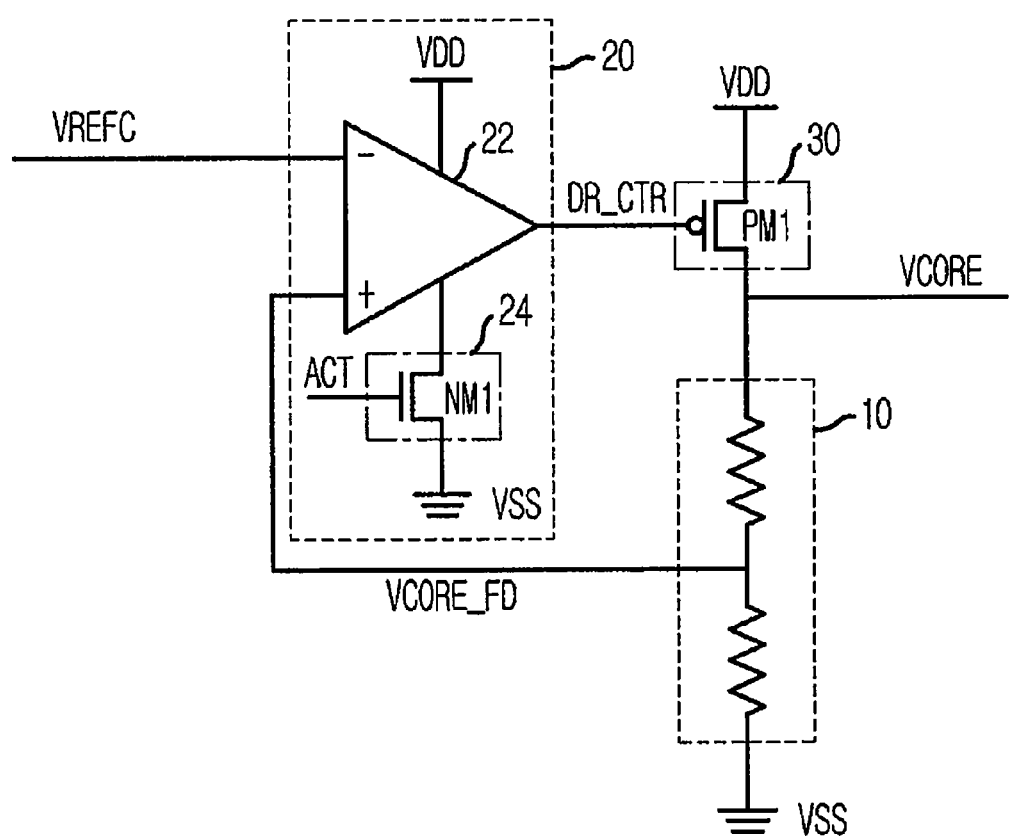
FIG. 1 is a circuit diagram of an internal voltage generator in accordance with a first embodiment of the present invention.

FIG. 1 is a circuit diagram showing an internal voltage generator in accordance with a first embodiment of the present invention.

Referring to FIG. 1, the internal voltage generator includes an internal voltage driver 30 for supplying an internal voltage VCORE, a feedback circuit 10 for supplying a feedback voltage VCORE_FD having a voltage level proportional to the internal voltage VCORE, and a control signal generating circuit 20 for generating a control signal DR_CTR to control the internal voltage driver 30 such that the feedback voltage VCORE_FD is maintained at a desired reference voltage VREFC.

The feedback circuit 10 includes a plurality of resistors connected in series between the interval voltage VCORE and a ground voltage VSS.

The control signal generating circuit 20 includes a differential amplifier 22 receiving the reference voltage VREFC and the feedback voltage VCORE_FD, and a driving controller 24 having an NMOS transistor NM1 for supplying a driving voltage to the differential amplifier 22 in response to a driving signal ACT.

The internal voltage driver 30 is configured with a PMOS transistor PM1 having a gate receiving the control signal DR_CRT and a drain-source path between an external voltage (VDD) supplying terminal and an internal voltage (VCORE) supplying terminal.

An operation of the internal voltage generator will now be described briefly.

The feedback circuit 10 divides the internal voltage VCORE to output the feedback voltage core voltage VCORE_FD having a voltage level proportional to the internal voltage VCORE. The control signal generating circuit 20 generates the control signal DR_CTR having a voltage level proportional to a level difference between the reference voltage VREFC and the feedback voltage VCORE_FD by using the differential amplifier 22. The control signal generating circuit 20 outputs the control signal DR_CTR when the driving controller 24 supplies the driving voltage to the differential amplifier 22 in response to the activation of the driving signal ACT. The internal voltage driver 30 drives the internal voltage (VCORE) supplying terminal according to the levels of the control signal DR_CTR. In this manner, the level of the internal voltage VCORE is adjusted according to the control signal DR_CTR.

Figure 2:
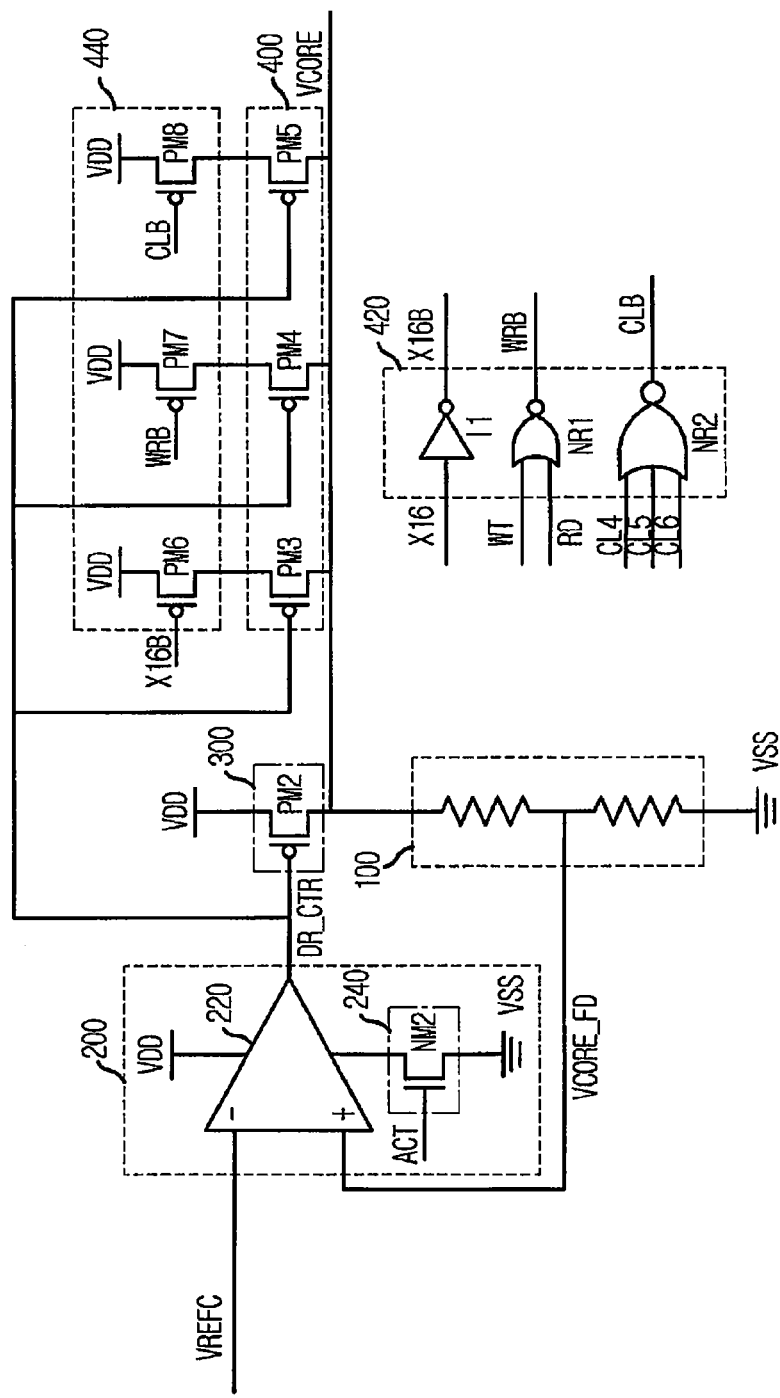
FIG. 2 is a circuit diagram of an internal voltage generator in accordance with a second embodiment of the present invention.

FIG. 2 is a circuit diagram showing an internal voltage generator in accordance with a second embodiment of the present invention.

Referring to FIG. 2, the internal voltage generator includes an internal voltage driver 300 for supplying an internal voltage VCORE, a feedback circuit 100 for supplying a feedback voltage VCORE_FD having a voltage level proportional to the internal voltage VCORE, a control signal generating circuit 200 for generating a control signal DR_CTR to control the internal voltage driver 300 such that the feedback voltage VCORE_FD is maintained at a desired reference voltage VREFC, and an auxiliary driving circuit 400 for additionally supplying the internal voltage VCORE in response to the control signal DR_CTR.

The feedback circuit 100 includes a plurality of resistors connected in series between the interval voltage VCORE and a ground voltage VSS.

The control signal generating circuit 200 includes a differential amplifier 220 receiving the reference voltage VREFC and the feedback voltage VCORE_FD, and a driving controller 240 having an NMOS transistor NM2 for supplying a driving voltage to the differential amplifier 220 in response to a driving signal ACT.

The internal voltage driver 300 is configured with a PMOS transistor PM2 having a gate receiving the control signal DR_CRT and a drain-source path between an external voltage (VDD) supplying terminal and an internal voltage (VCORE) supplying terminal.

The auxiliary driving circuit 400 includes a plurality of first to third auxiliary drivers PM3, PM4 and PM5 for controlling a drivability of the internal voltage driver 300 according to desired situations.

The internal voltage generator further includes an auxiliary driving control circuit for allowing the auxiliary driving circuit 400 to be activated in response to the control signal DR_CTR only when the device is expected to dissipate a large amount of current.

The auxiliary driving control circuit includes an auxiliary driving signal generator 420 and a driving voltage generator 440. The auxiliary driving signal generator 420 detects an application of a command causing a large amount of current dissipation to generate auxiliary driving signals X16B, WRB and CLB. The driving voltage generator 440 supplies a driving voltage of the auxiliary driving circuit 400 in response to the auxiliary driving signals X16B, WRB and CLB. Herein, the auxiliary driving signal X16B means a mode driving signal X16B; the auxiliary driving signal WRB means a column driving signal WRB; and the auxiliary driving signal CLB means a column address strobe (CAS) driving voltage CLB.

The auxiliary driving signal generator 420 and the driving voltage generator 440 are responsive to kinds of detected commands.

The driving voltage generator 440 includes a first driving voltage generating unit PM6, a second driving voltage generating unit PM7, and a third driving voltage generating unit PM8. The first driving voltage generating unit PM6 supplies the external voltage VDD as a driving voltage of the first auxiliary driver PM3 in response to the mode driving signal X16B. The second driving voltage generating unit PM7 supplies the external voltage VDD as a driving voltage of the second auxiliary driver PM4 in response to the column driving signal WRB. The third driving voltage generating unit PM8 supplies the external voltage VDD as a driving voltage of the third auxiliary driver PM5 in response to the CAS driving voltage CLB.

The first driving voltage generating unit PM6 includes a PMOS transistor having a gate receiving the mode driving signal X16B and a source connected to the external voltage VDD. The first auxiliary driver PM3 includes a PMOS transistor having a gate receiving the control signal DR_CTR and a source-drain path between a drain of the PMOS transistor PM6 and an internal voltage (VCORE) supplying terminal. The second and third driving voltage generating units PM7 and PM8 and the second and third auxiliary drivers PM4 and PM5 are configured in the same manner as the first driving voltage generating unit PM6 and the first auxiliary driver PM3, except the driving signals. The auxiliary driving signal generator 420 receives an X16 mode signal X16, a read signal RD, a write signal WT, and CAS signals CL4, CL5 and CL6 and activates the corresponding driving signals X16B, WRB and CLB when the device is expected to dissipate a large amount of current. In response to the activated driving signals X16B, WRB and CLB, the driving voltage generator 440 supplies the driving voltage to the auxiliary driving circuit 400 and thus the internal voltage VCORE is supplied.

The auxiliary driving signal generator 420 includes a mode driving signal generating unit, a column driving signal generating unit, and a CAS driving signal generating unit. The mode driving signal generating unit includes an inverter I1 for inverting the activated X16 mode signal X16 to output the mode driving signal X16B. The column driving signal generating unit includes a first NOR gate NR1 for outputting the column driving signal WRB when one of the write signal WT and the read signal RD is activated. The CAS driving signal generating unit includes a second NOR gate NR2 for outputting the CAS driving signal CLB when one of the CAS driving signals CL4, CL5 and CL6 is activated.

Operation of the internal voltage generator in accordance with the present invention will be described below. Specifically, the operation of the auxiliary drivers PM3, PM4 and PM5 that additionally supply the external voltage VDD when a command expected to dissipate a large amount of a current is input will be described.

When the X16 mode signal X16 is activated with a logic level 'HIGH', the mode driving signal generating unit activates the mode driving signal X16B with a logic level 'LOW'. When the write signal WT or the read signal RD is activated with a logic level 'HIGH', the column driving signal generating unit activates the column driving signal WRB with a logic level 'LOW'. When one of the CAS signals CL4, CL5 and CL6 is activated to a logic level 'HIGH', the CAS driving signal generating unit activates the CAS driving signal CLB to a logic level 'LOW'.

The first to third driving voltage generating units PM6, PM7 and PM8 supply the external voltage VDD as the driving voltages of the first to third auxiliary drivers PM3, PM4 and PM5 in response to the activation of the corresponding driving signals.

As described above, the internal voltage generator in accordance with the present invention includes the additional auxiliary drivers PM3, PM4 and PM5 that are activated in response to the control signal DR_CTR, thereby solving the problem of increasing the standby current due to the configuration of the plurality of the internal voltage generators themselves.

The internal voltage generator additionally activates the auxiliary drivers PM3, PM4 and PM5 only when the commands X16, WT, RD, CL4, CL5 and CL6 expected to dissipate a large amount of a current are input. Therefore, the actual size of the driver for driving the internal voltage VCORE is increased according to the situations in which a large amount of current is required.

Accordingly, by further providing the controller for controlling the driver and the activation thereof, the internal voltage can be stably supplied without increasing the standby current when a large amount of current is required.

As described above, the pull-up/pull-down drivability can be secured regardless of the process characteristic and temperature condition. Thus, the signal integrity of the output driver can be secured and the reliability of the semiconductor device can be improved.

The present application contains subject matter related to Korean patent application Nos. 2005-90940 & 2005-123982, filed in the Korean Intellectual Property Office on Sep. 29, 2005 & Dec. 15, 2005, respectively, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An internal voltage generator, comprising:
    an internal voltage driver for supplying an internal voltage based on a control signal;
    a feedback circuit for supplying a feedback voltage having a voltage level proportional to the internal voltage;
    a control signal generating circuit for generating the control signal to control the internal voltage driver such that the feedback voltage is maintained at a desired reference voltage;
    an auxiliary driving circuit for additionally supplying the internal voltage in response to the control signal;
    an auxiliary driving signal generator for detecting an application of a command causing a large amount of current dissipation and generating a plurality of auxiliary driving signals; and
    a driving voltage generator for supplying a driving voltage of the auxiliary driving circuit in response to the plurality of auxiliary driving signals.

2. The internal voltage generator as recited in claim 1, wherein the auxiliary driving circuit includes a plurality of auxiliary drivers corresponding to the number of the plurality of auxiliary driving signals, for additionally supplying the internal voltage according to an amount of current dissipation.

3. The internal voltage generator as recited in claim 2, wherein the driving voltage generator includes a plurality of driving voltage generating units corresponding to the number of the plurality of auxiliary driving signals.

4. The internal voltage generator as recited in claim 3, wherein the auxiliary driving signal generator activates the auxiliary driving signals when an output data bit signal, a read signal, a write signal, or a column address strobe (CAS) signal is input.

5. The internal voltage generator as recited in claim 4, wherein the auxiliary driving signal generator includes:
    a mode driving signal generating unit for outputting a mode driving signal in response to the output data bit signal;
    a column driving signal generating unit for outputting a column driving signal in response to the write signal and the read signal; and
    a CAS driving signal generating unit for outputting a CAS driving signal in response to the plurality of CAS driving signals.

6. The internal voltage generator as recited in claim 5, wherein the mode driving signal generating unit includes an inverter for inverting the output data bit signal to output the inverted signal as the mode driving signal.

7. The internal voltage generator as recited in claim 5, wherein the column driving signal generating unit includes a first NOR gate for receiving the write signal and the read signal to output the column driving signal.

8. The internal voltage generator as recited in claim 5, wherein the CAS driving signal generating unit includes a second NOR gate for receiving the plurality of CAS signals to output the driving signal.

9. The internal voltage generator as recited in claim 5, wherein the auxiliary driving circuit includes:
    a first auxiliary driver for additionally supplying the internal voltage in response to the control signal when the mode driving signal is activated;
    a second auxiliary driver for additionally supplying the internal voltage in response to the control signal when the column driving signal is activated; and
    a third auxiliary driver for additionally supplying the internal voltage in response to the control signal when the CAS driving signal is activated.

10. The internal voltage generator as recited in claim 9, wherein the driving voltage generator includes:
    a first driving voltage generating unit for supplying an external voltage as a driving voltage of the first auxiliary driver in response to the mode driving signal;
    a second driving voltage generating unit for supplying the external voltage as a driving voltage of the second auxiliary driver in response to the column driving signal; and
    a third driving voltage generating unit for supplying the external voltage as a driving voltage of the third auxiliary driver in response to the CAS driving voltage.

11. The internal voltage generator as recited in claim 10, wherein the first driving voltage generating unit includes a first PMOS transistor having a gate receiving the mode driving signal and a source connected to the external voltage supplying terminal, a voltage of a drain being supplied as the driving voltage of the first auxiliary driver.

12. The internal voltage generator as recited in claim 11, wherein the first auxiliary driver includes a second PMOS transistor having a gate receiving the control signal and a source-drain path between the drain of the first PMOS transistor and an internal voltage supplying terminal.

13. The internal voltage generator as recited in claim 1, wherein the feedback circuit includes a plurality of resistors connected in series between the interval voltage and a ground voltage supplying terminal.

14. The internal voltage generator as recited in claim 1, wherein the control signal generating circuit includes:
    a differential amplifier for amplifying and comparing the desired reference voltage with the feedback voltage; and
    a driving controller for supplying a driving voltage to the differential amplifier in response to a driving signal.

15. The internal voltage generator as recited in claim 14, wherein the driving controller includes an NMOS transistor.

16. The internal voltage generator as recited in claim 1, wherein the internal voltage driver includes a PMOS transistor having a gate receiving the control signal and a drain-source path between an external voltage supplying terminal and an internal voltage.

17. An internal voltage supplying unit, comprising:
    an internal voltage generating unit for generating an internal voltage;
    a stabilizing unit for stabilizing a level of output terminal of the internal voltage generating unit; and
    a control unit for controlling the stabilizing unit by detecting an application of a command causing a large amount of current dissipation.

18. The internal voltage generator as recited in claim 17, wherein the control unit includes an auxiliary driving signal generator for generating a plurality of auxiliary driving signals.

19. The internal voltage generator as recited in claim 18, wherein the stabilizing unit includes:
    an auxiliary driving circuit for additionally supplying the internal voltage; and a driving voltage generator for supplying a driving voltage of the auxiliary driving circuit in response to the plurality of auxiliary driving signals.

20. The internal voltage generator as recited in claim 19, wherein the auxiliary driving circuit includes a plurality of auxiliary drivers corresponding to the number of the plurality of auxiliary driving signals, for additionally supplying the internal voltage according to an amount of current dissipation.

21. The internal voltage generator as recited in claim 20, wherein the driving voltage generator includes a plurality of driving voltage generating units corresponding to the number of the plurality of auxiliary driving signals.

22. The internal voltage generator as recited in claim 21, wherein the auxiliary driving signal generator activates the auxiliary driving signals when an output data bit signal, a read signal, a write signal, or a column address strobe (CAS) signal is input.

23. The internal voltage generator as recited in claim 22, wherein the auxiliary driving signal generator includes:
   a mode driving signal generating unit for outputting a mode driving signal in response to the output data bit signal;
   a column driving signal generating unit for outputting a column driving signal in response to the write signal and the read signal; and
   a CAS driving signal generating unit for outputting a CAS driving signal in response to the plurality of CAS driving signals.

24. The internal voltage generator as recited in claim 23, wherein the mode driving signal generating unit includes an inverter for inverting the output data bit signal to output the inverted signal as the mode driving signal.

25. The internal voltage generator as recited in claim 23, wherein the column driving signal generating unit includes a first NOR gate for receiving the write signal and the read signal to output the column driving signal.

26. The internal voltage generator as recited in claim 23, wherein the CAS driving signal generating unit includes a second NOR gate for receiving the plurality of CAS signals to output the driving signal.

27. The internal voltage generator as recited in claim 23, wherein the auxiliary driving circuit includes:
   a first auxiliary driver for additionally supplying the internal voltage when the mode driving signal is activated;
   a second auxiliary driver for additionally supplying the internal voltage when the column driving signal is activated; and
   a third auxiliary driver for additionally supplying the internal voltage when the CAS driving signal is activated.

28. The internal voltage generator as recited in claim 27, wherein the driving voltage generator includes:
   a first driving voltage generating unit for supplying an external voltage as a driving voltage of the first auxiliary driver in response to the mode driving signal;
   a second driving voltage generating unit for supplying the external voltage as a driving voltage of the second auxiliary driver in response to the column driving signal; and
   a third driving voltage generating unit for supplying the external voltage as a driving voltage of the third auxiliary driver in response to the CAS driving voltage.

* * * * *